United States Patent [19]
Chittipeddi et al.

[11] Patent Number: 5,439,847
[45] Date of Patent: Aug. 8, 1995

[54] INTEGRATED CIRCUIT FABRICATION WITH A RAISED FEATURE AS MASK

[75] Inventors: Sailesh Chittipeddi, Whitehall; William T. Cochran, New Tripoli, both of Pa.

[73] Assignee: AT&T Corp., Murray Hill, N.J.

[21] Appl. No.: 147,368

[22] Filed: Nov. 5, 1993

[51] Int. Cl.6 .................. H01L 21/283; H01L 21/316
[52] U.S. Cl. ..................................... 437/192; 437/228
[58] Field of Search .............. 437/190, 192, 228; 156/653, 659.1

[56] References Cited

U.S. PATENT DOCUMENTS

| | | | |
|---|---|---|---|
| 4,382,827 | 5/1983 | Romano-Moran et al. | 148/1.5 |
| 4,676,869 | 6/1987 | Lee et al. | 156/643 |
| 4,728,617 | 3/1988 | Woo et al. | 437/30 |
| 4,786,609 | 11/1988 | Chen | 437/30 |
| 4,820,271 | 4/1989 | Arnold, III et al. | 430/271 |
| 5,041,397 | 8/1991 | Kim et al. | 437/240 |
| 5,211,804 | 5/1993 | Kobayashi | 156/665 |
| 5,264,076 | 11/1993 | Cuthbert et al. | 156/657 |

FOREIGN PATENT DOCUMENTS 62-45071 2/1987 Japan .
62-241376 10/1987 Japan .

OTHER PUBLICATIONS

Wolf., S., Silicon Processing, vol. 2, 1990, Lattice Press, pp. 189–194, 127–128, 229–236.
Wolf., S., et al., Silicon Processing, vol. 1, 1986, Lattice Press, pp. 182–194.
"A 2.3um$^2$ Memory Cell Structure for 16Mb NAND EEPROMs," Shirota et al., Toshiba Corp., 1990 IEEE, IEDM pp. 90-103—90-106.

Primary Examiner—T. N. Quach
Attorney, Agent, or Firm—John T. Rehberg

[57] ABSTRACT

A method for etching metal conductors and stacks of conductors is disclosed. A doped silicon dioxide layer is deposited upon a metal or stack of conductive layers to be etched. A silicon dioxide layer is doped with phosphorous. Next, the silicon dioxide layer is partially etched and the photoresist removed. Subsequent etching utilizes the raised feature created in the silicon dioxide layer as a mask to etch the underlying metal or stack of conductors.

10 Claims, 2 Drawing Sheets

INTEGRATED CIRCUIT FABRICATION WITH A RAISED FEATURE AS MASK

TECHNICAL FIELD

This invention relates to semiconductor integrated circuits and methods for their fabrication.

BACKGROUND OF THE INVENTION

Typical integrated circuits often include conductive runners which connect individual transistors to each other. The conductors are often formed by depositing a blanket layer of conductive material such as aluminum upon a dielectric substrate. A patterned photoresist is formed on top of the conductive material. The patterned photoresist is used as a mask for the subsequent anisotropic etching of the conductive material. Many times, several layers of conductive material are etched sequentially to form a multi-layered conductor. However, linewidth control and pattern sensitivity are problems frequently encountered in etching several layers of conductive material.

SUMMARY OF THE INVENTION

The above-mentioned problems are alleviated by the inventive method which illustratively includes:
  forming at least one conductive layer overlying a substrate;
  forming a material layer overlying the conductive layer;
  forming a patterned photoresist upon the material layer;
  using the patterned photoresist as a first mask, etching at least partially through the material layer, thereby forming a raised feature;
  removing the photoresist;
  using the raised feature as a mask, etching the conductive layer, thereby forming a raised conductive feature on the substrate, and then removing the raised feature.

BRIEF DESCRIPTION OF THE INVENTION

FIGS. 1–5 are cross-sectional views of a portion of an integrated circuit having an illustrative embodiment of the present invention.

DETAILED DESCRIPTION

Figure 1:
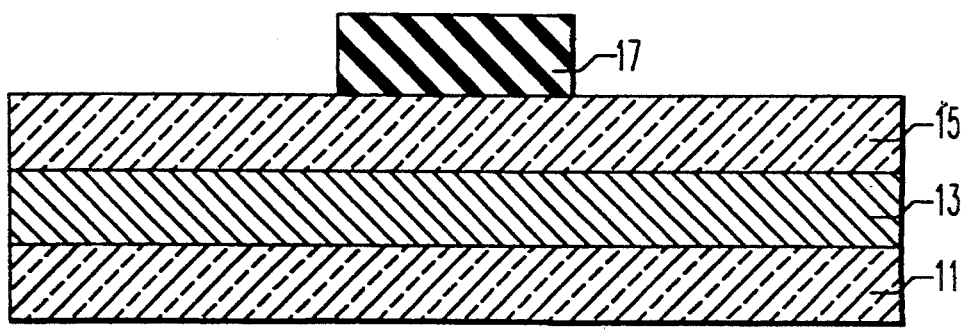

In FIG. 1, reference numeral 11 denotes a substrate which may typically be a dielectric. Often, substrate 11 is an oxide of silicon or a silicon oxynitride. In general, the term substrate refers to a body or layer upon which other bodies or layers may be formed. Dielectric 11 may cover a plurality of transistors formed in a silicon substrate.

Reference numeral 13 denotes a metallic layer which may, illustratively, be aluminum, copper or tungsten, as will be further explained below. A multiplicity of conductive, barrier and anti-reflective layers may be substituted for layer 13.

Reference numeral 15 denotes an oxide of silicon which may, illustratively, be formed by a plasma-enhanced TEOS process. Layer 15 is doped with phosphorous. A typical phosphorous doping level is 2–6% by weight. Boron (2–6%) may be added in addition to phosphorous. Reference numeral 17 denotes a patterned photoresist.

Figure 2:
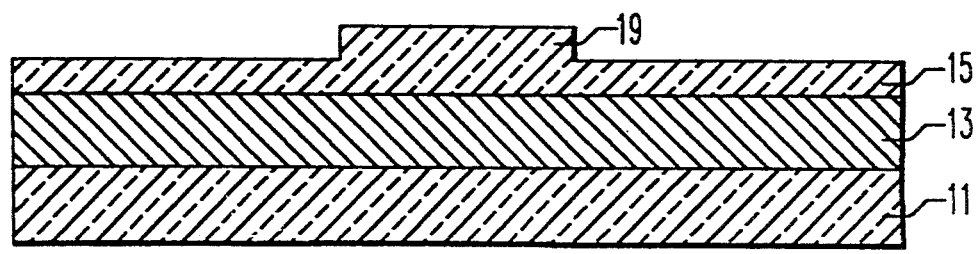

In FIG. 2, layer 15 has been anisotropically etched, using patterned photoresist 17 as a mask. The partial etching creates raised feature 19 in layer 15. After the creation of raised feature 19, photoresist 17 is removed. It has been found that the partial etching of layer 15, thereby creating raised feature 19, and the subsequent removal of photoresist 17 is an etching process which exhibits less pattern sensitivity than etching processes which include completely etching through layer 15 with photoresist 17 in place. Thus, when raised feature 19 is used as a mask, both isolated and closely-spaced features may be etched with good definition.

The use of doping in layer 15 is particularly advantageous. If an undoped silicon dioxide were used as layer 15, sodium in photoresist 17 would be driven into layer 15 and ultimately degrade device performance. Experiments have shown that the presence of sodium in layer 15 often causes bake-recoverable failures of devices.

Figure 3:
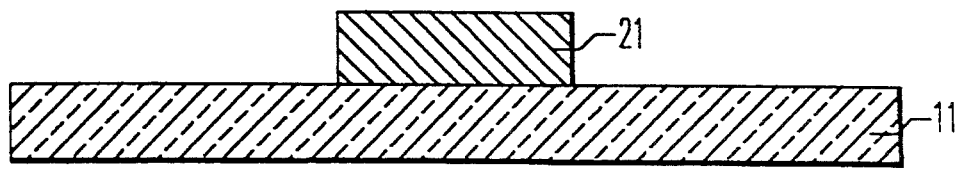

Turning to FIG. 3, raised feature 19 of FIG. 2 has been utilized as a mask for further anisotropic etching of the remainder of layer 15 and additional anisotropic etching of layer 13, thereby producing patterned metal runner 21. Raised feature 19 has been removed.

Figure 4:
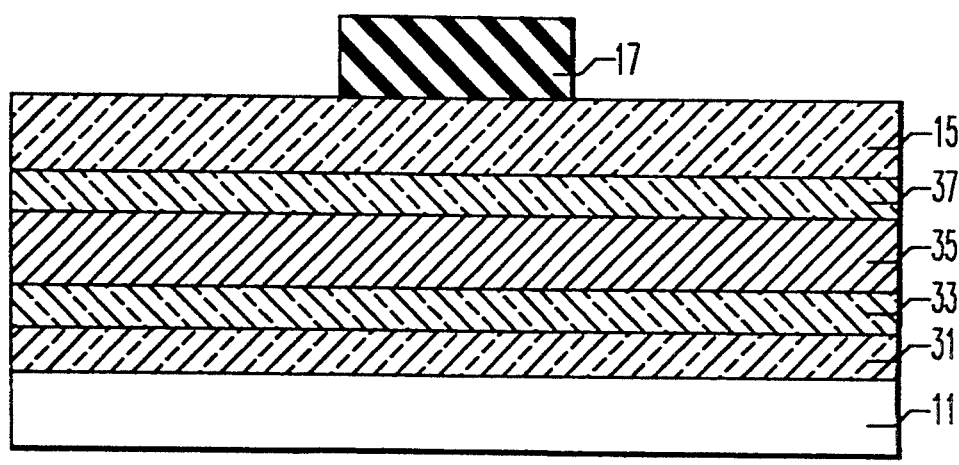
Figure 5:
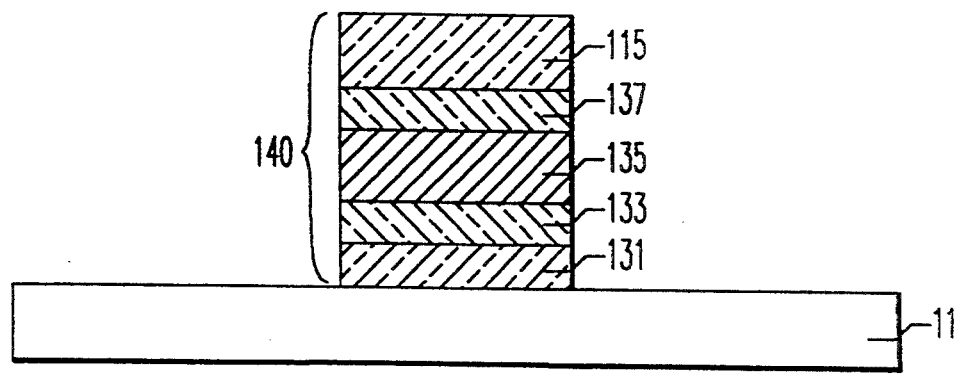

Another embodiment of the present invention is illustrated in FIGS. 4–5. Reference numeral 11 denotes a substrate, discussed above. Reference numeral 31 is a layer of titanium, typically having a thickness between 100 and 1000 Å. Reference numeral 33 is a layer of titanium nitride, typically having a thickness between 100 and 1000 Å. Reference numeral 35 is an aluminum layer, typically having a thickness between 2000 and 10,000 Å. Reference numeral 37 is a layer of titanium nitride, utilized as an anti-reflective coating, typically having a thickness between 50 and 500 Å. Alternatively, layer 37 may be titanium tungsten having the same thickness.) Reference numeral 15 is a layer of silicon dioxide formed from TEOS and doped with phosphorous, 2–6% by weight. Reference numeral 17 is a patterned photoresist. Layer 15 may be formed by plasma-enhanced chemical vapor deposition performed at a temperature below the melting point of aluminum. The purpose of layers 33 and 31 is to help prevent stress induced and/or electromigration induced failures.

Layer 15 is partially etched using patterned photoresist 17 as a mask. Typically, at least 500 Å are etched away from layer 15, thereby creating a raised feature similar to feature 19 depicted in FIG. 2. Utilizing the raised feature as a mask and removing the photoresist 17, the structure in FIG. 15 is obtained. Reference numeral 13 1 denotes the remainder of titanium layer 31; reference numeral 133 denotes the remainder of titanium nitride layer 33; reference numeral 135 denotes the remainder of aluminum layer 35; reference numeral 137 denotes the remainder of titanium nitride layer 37; and reference numeral 115 denotes the remainder of silicon dioxide layer 15. The etched stack of layers 115, 137, 135, 133 and 131 denotes a runner stack which may be denoted by reference numeral 140. Subsequent processing may include, for example, removing (if desired) layer 115 and then covering the exposed portions of substrate 11 and stack 140 with a dielectric layer. Layer 115 may be removed using wet or downstream dry etching techniques using $CF_4$. Whatever removal technique is used, it should have good selectivity to the underlying conductor and substrate. It may be desirable to permit doped silicon dioxide layer 115 to remain on top of the stack depicted in FIG. 5. Alternatively, layer 115 may be removed. However, if layer 137 is absent and if layer 115 is permitted to remain on top of stack 140, the underlying aluminum may be attacked by phosphoric acid (formed by phosphorous in layer 115) during subsequent water rinsing.

Partial etching of layer 15 permits better linewidth control for etching stacks such as stack 140. Furthermore, it helps to eliminate pattern dependence in anisotropic reactive ion etching. The presence of dopants in layer 115 serves as a sodium getter, thereby preventing sodium from photoresist from interfering with circuit performance.

A variety of other materials may be chosen for layer 15, including BPTEOS, BPSG, PSG, PPETEOS and spin-on glass. Layer 15 may be a silicon oxide whose doping gradually increases from bottom to top. In general, layer 15 may be a doped oxide of silicon. Layer 15 may be formed from a variety of precursors, including TEOS, silane and DADBS. Or layer 15 may be a doped silica glass. Various techniques in addition to that already mentioned may be used to remove layer 15, such as dry etching or etching in unbuffered HF.

If desired, layer 15 may be a bilayer. For example, layer 15 may be a bilayer of silicon oxide under phosphorous-doped silicon oxide. Originally, layer 15 may be a bilayer having a layer of doped silicon oxide over a layer of undoped silicon oxide. Alternatively, layer 15 may be plasma-enhanced undoped TEOS oxide under plasma-enhanced phosphorous doped TEOS oxide. Or, layer 15 may be silicon nitride under plasma-enhanced TEOS. Spin-on glass (SOG) may be substituted for TEOS oxide. Other precursors such as DADBS or silane may be used. It is important that whatever layer is uppermost, that it exhibit good etch selectivity to the underlying substrate 11 and other underlying layers.

We claim:

1. A method of integrated circuit fabrication comprising:
   forming at least one conductive layer overlying a substrate;
   forming a layer of material overlying said conductive layer;
   forming a patterned photoresist upon said layer of material;
   using said patterned photoresist as a first mask, etching partially through said layer of material, thereby forming a raised feature;
   removing said photoresist;
   using said raised feature as a mask, etching said conductive layer, thereby forming a raised conductive feature upon said substrate; and
   removing said raised feature.

2. The method of claim 1 in which said conductive material is chosen from the group consisting of copper, aluminum, tungsten and refractory metal silicide.

3. The method of claim 1 in which an anti-reflective coating is formed between said conductive layer and said layer of material and said anti-reflective coating is etched prior to said conductive layer.

4. The method of claim 3 in which said anti-reflective coating is chosen from the group consisting of titanium nitride and titanium tungsten.

5. The method of claim 1 in which a layer of titanium nitride is formed between said layer of conductive material and said substrate and said layer of titanium nitride is etched after said conductive layer.

6. The method of claim 5 in which a layer of titanium is formed between said layer of titanium nitride and said substrate and said layer of titanium is etched after said layer of titanium nitride.

7. The method of claim 1 in which said layer of material is chosen from the group consisting of oxide doped with phosphorous, BPTEOS, BPSG, PSG, PPETEOS and spin-on glass.

8. The method of claim 1 in which said material layer is a bilayer and said bilayer is chosen from the group consisting of:
   plasma-enhanced undoped silicon oxide under plasma-enhanced phosphorous doped silicon oxide;
   silicon nitride under plasma-enhanced doped silicon oxide; and
   undoped silicon oxide under doped silicon oxide.

9. The method of claim 1 in which said material layer is a silicon oxide whose doping gradually increases from bottom to top.

10. A method of integrated circuit fabrication comprising:
    forming a layer of titanium upon a substrate of silicon dioxide;
    forming a first layer of titanium nitride upon said layer of titanium;
    forming a layer of aluminum upon said layer of titanium nitride;
    forming a second layer of titanium nitride upon said layer of aluminum;
    forming a layer of silicon oxide doped with phosphorous;
    forming a patterned photoresist upon said layer of silicon dioxide;
    using said patterned photoresist as a first mask, etching partially through said layer of silicon dioxide, thereby forming a raised feature;
    removing said photoresist;
    using said raised feature as a mask, etching said second layer of titanium nitride and said layer of aluminum and said first layer of titanium to form a conductive runner having an overlayer of silicon dioxide;
    completing fabrication of said integrated circuit with said overlayer of doped silicon oxide remaining in place.

* * * * *